United States Patent
Lin et al.

(10) Patent No.: US 10,056,388 B2
(45) Date of Patent: Aug. 21, 2018

(54) METHOD FOR FABRICATING SEMICONDUCTOR DEVICE

(71) Applicants: UNITED MICROELECTRONICS CORP., Hsin-Chu (TW); Fujian Jinhua Integrated Circuit Co., Ltd., Quanzhou, Fujian province (CN)

(72) Inventors: Ger-Pin Lin, Tainan (TW); Yung-Ming Wang, Taichung (TW); Tien-Chen Chan, Tainan (TW); Shu-Yen Chan, Changhua County (TW)

(73) Assignees: UNITED MICROELECTRONICS CORP., Hsin-Chu (TW); Fujian Jinhua Integrated Circuit Co., Ltd., Quanzhou, Fujian province (CN)

( * ) Notice: Subject to any disclaimer, the term of this patent is extended or adjusted under 35 U.S.C. 154(b) by 0 days.

(21) Appl. No.: 15/465,622

(22) Filed: Mar. 22, 2017

(65) Prior Publication Data

US 2018/0190660 A1 Jul. 5, 2018

(30) Foreign Application Priority Data

Dec. 30, 2016 (CN) .......................... 2016 1 1258719

(51) Int. Cl.
| | |
|---|---|
| *H01L 29/423* | (2006.01) |
| *H01L 27/108* | (2006.01) |
| *H01L 21/265* | (2006.01) |
| *H01L 29/10* | (2006.01) |
| *H01L 29/49* | (2006.01) |
| *H01L 21/762* | (2006.01) |

(Continued)

(52) U.S. Cl.
CPC .. *H01L 27/10876* (2013.01); *H01L 21/26513* (2013.01); *H01L 21/76237* (2013.01); *H01L 27/10823* (2013.01); *H01L 29/105* (2013.01); *H01L 29/1037* (2013.01); *H01L 29/1041* (2013.01); *H01L 29/4236* (2013.01); *H01L 29/495* (2013.01); *H01L 29/66621* (2013.01); *H01L 29/78* (2013.01)

(58) Field of Classification Search
CPC ......... H01L 27/10876; H01L 27/10823; H01L 27/10838; H01L 27/10841; H01L 27/10888; H01L 27/10885; H01L 29/4236; H01L 29/1033; H01L 29/1037; H01L 29/1041; H01L 29/1045; H01L 29/66621; H01L 29/78
See application file for complete search history.

(56) References Cited

U.S. PATENT DOCUMENTS 7,393,749 B2 * 7/2008 Yilmaz ............. H01L 29/66727
257/330
9,130,009 B2 * 9/2015 Manabe ................ H01L 21/743
(Continued)

*Primary Examiner* — Michael Trinh
(74) *Attorney, Agent, or Firm* — Winston Hsu

(57) ABSTRACT

A method for fabricating semiconductor device includes the steps of: providing a substrate having a memory region defined thereon; forming a trench in the substrate; performing a first ion implantation process to form a first doped region having a first conductive type in the substrate adjacent to the trench; forming a gate electrode in the trench; and performing a second ion implantation process to form a second doped region having a second conductive type in the substrate above the gate electrode.

9 Claims, 4 Drawing Sheets

(51) Int. Cl.
*H01L 29/66* (2006.01)
*H01L 29/78* (2006.01)

(56) References Cited

U.S. PATENT DOCUMENTS

| | | | | |
|---|---|---|---|---|
| 2003/0209767 A1* | 11/2003 | Takahashi | ............ | H01L 27/115 |
| | | | | 257/390 |
| 2010/0264488 A1* | 10/2010 | Hsieh | .................. | H01L 29/1095 |
| | | | | 257/334 |
| 2014/0246718 A1* | 9/2014 | Taketani | ........... | H01L 21/28211 |
| | | | | 257/330 |
| 2015/0069482 A1 | 3/2015 | Mueller et al. | | |
| 2016/0181385 A1* | 6/2016 | Kim | .................. | H01L 29/66621 |
| | | | | 257/4 |
| 2016/0204201 A1 | 7/2016 | Oh et al. | | |

\* cited by examiner

METHOD FOR FABRICATING SEMICONDUCTOR DEVICE

BACKGROUND OF THE INVENTION

1. Field of the Invention

The invention relates to a method for fabricating semiconductor device, and more particularly to a method for fabricating a dynamic random access memory (DRAM) device.

2. Description of the Prior Art

As electronic products develop toward the direction of miniaturization, the design of dynamic random access memory (DRAM) units also moves toward the direction of higher integration and higher density. Since the nature of a DRAM unit with buried gate structures has the advantage of possessing longer carrier channel length within a semiconductor substrate thereby reducing capacitor leakage, it has been gradually used to replace conventional DRAM unit with planar gate structures.

Typically, a DRAM unit with buried gate structure includes a transistor device and a charge storage element to receive electrical signals from bit lines and word lines. Nevertheless, current DRAM units with buried gate structures still pose numerous problems due to limited fabrication capability. Hence, how to effectively improve the performance and reliability of current DRAM device has become an important task in this field.

SUMMARY OF THE INVENTION

A method for fabricating semiconductor device includes the steps of: providing a substrate having a memory region defined thereon; forming a trench in the substrate; performing a first ion implantation process to form a first doped region having a first conductive type in the substrate adjacent to the trench; forming a gate electrode in the trench; and performing a second ion implantation process to form a second doped region having a second conductive type in the substrate above the gate electrode.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
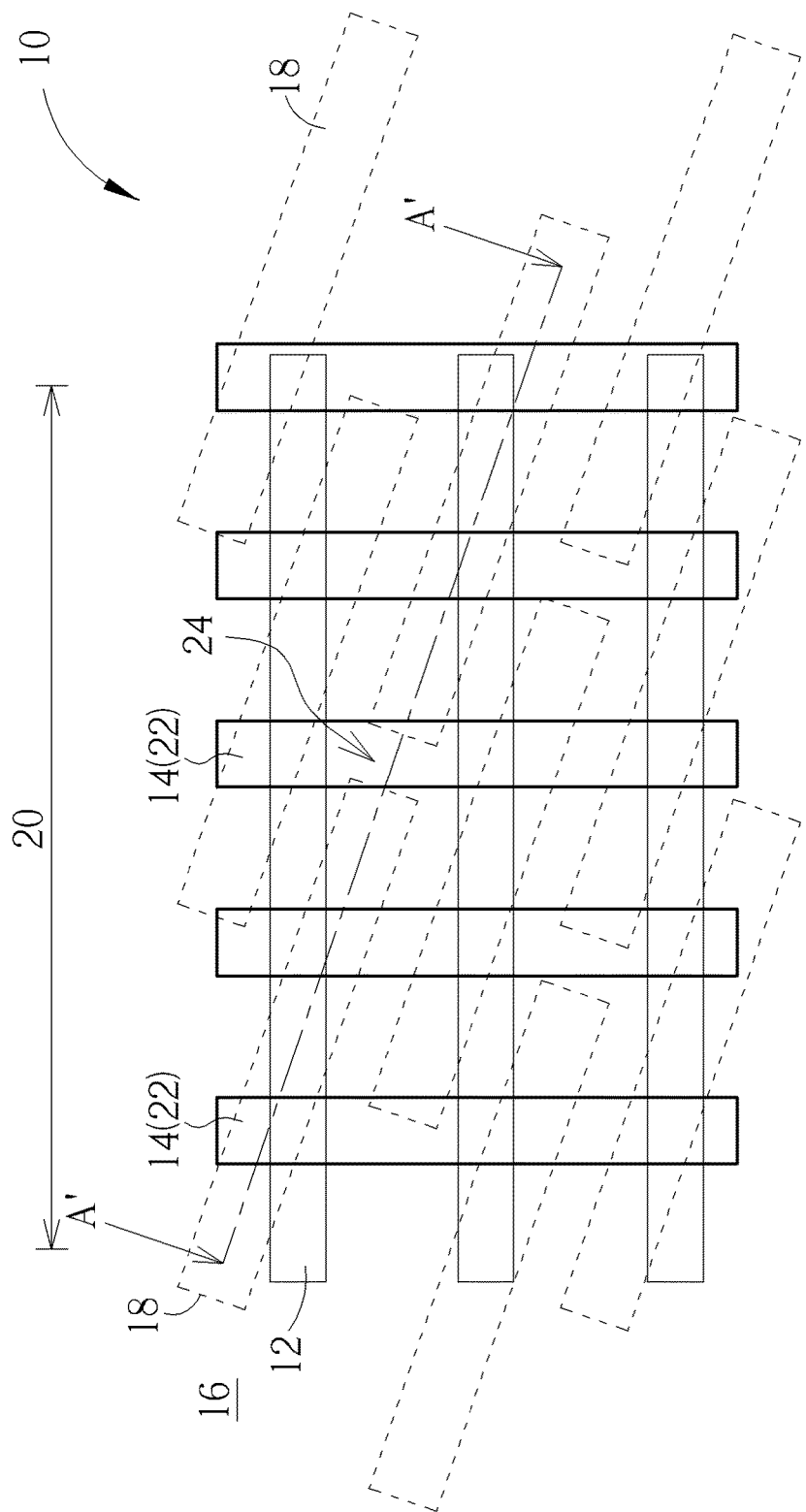
FIGS. 1-6 illustrate a method for fabricating a DRAM device according to a preferred embodiment of the present invention.

Referring to FIGS. 1-6, FIGS. 1-6 illustrate a method for fabricating a DRAM device according to a preferred embodiment of the present invention, in which FIG. 1 illustrates a top-view diagram and FIGS. 2-6 illustrate cross-sectional views of FIG. 1 along the sectional line AA'. Preferably, the present embodiment pertains to fabricate a memory device, and more particularly a DRAM device 10, in which the DRAM device 10 includes at least a transistor device (not shown) and at least a capacitor structure (not shown) that will be serving as a smallest constituent unit within the DRAM array and also used to receive electrical signals from bit lines 12 and word lines 14.

As shown in FIG. 1, the DRAM device 10 includes a substrate 16 such as a semiconductor substrate or wafer made of silicon, a shallow trench isolation (STI) 24 formed in the substrate 16, and a plurality of active areas (AA) 18 defined on the substrate 16. A memory region 20 and a periphery region (not shown) are also defined on the substrate 16, in which multiple word lines 14 and multiple bit lines 12 are preferably formed on the memory region 20 while other active devices (not shown) could be formed on the periphery region. For simplicity purpose, only devices or elements on the memory region 20 are shown in FIG. 1 while elements on the periphery region are omitted.

In this embodiment, the active regions 18 are disposed parallel to each other and extending along a first direction, the word lines 14 or multiple gates 22 are disposed within the substrate 16 and passing through the active regions 18 and STIs 24. Preferably, the gates 22 are disposed extending along a second direction, in which the second direction crosses with the first direction at an angle less than 90 degrees.

The bit lines 12 on the other hand are disposed on the substrate 16 parallel to each other and extending along a third direction while crossing the active regions 18 and STI 24, in which the third direction is different from the first direction and orthogonal to the second direction. In other words, the first direction, second direction, and third direction are all different from each other while the first direction is not orthogonal to both the second direction and the third direction. Preferably, contact plugs such as bit line contacts (BLC) (not shown) are formed in the active regions 18 adjacent to two sides of the word lines 14 to electrically connect to source/drain region (not shown) of each transistor element and storage node contacts (not shown) are formed to electrically connect to a capacitor.

Figure 2:
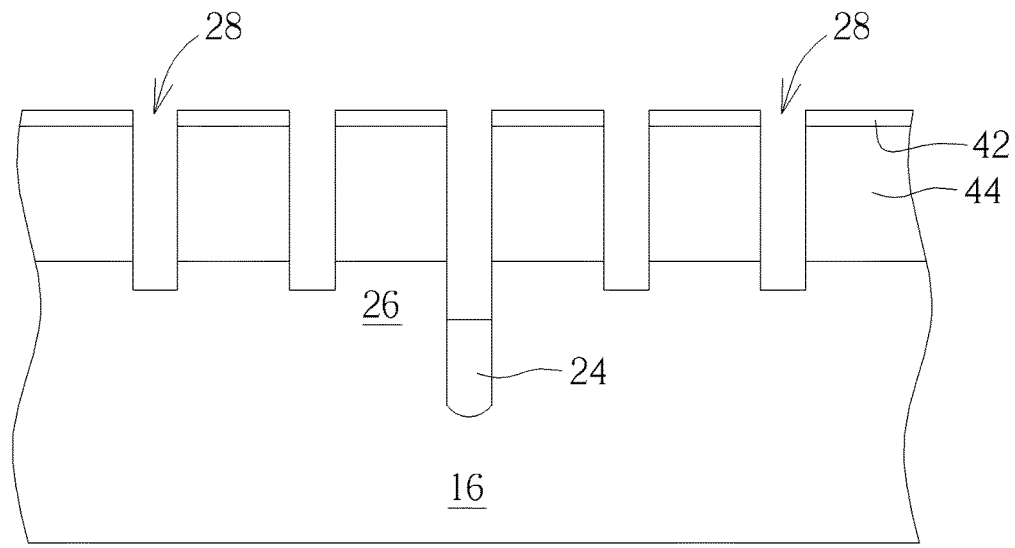

The fabrication of word lines 14 (or also referred to as buried word lines) is explained below. As shown in FIG. 2, an insulating layer 42 preferably made of silicon oxide is formed on the surface of the substrate 16, and a shallow trench isolation (STI) 24 is formed in the substrate 16 to define the memory region 18. Next, an ion implantation process is conducted by implanting ions having first conductive type, such as p-type dopants or ions into the substrate 16 to form a well region 26, in which the injected p-type dopants could include boron, but not limited thereto. In this embodiment, if boron were implanted, the energy of the implantation process is preferably between 30 KeV to 200 KeV and the dosage of the dopants is preferably between 5E12 atoms/cm$^2$ to 1E14 atoms/cm$^2$.

Next, another ion implantation process is conducted to implant ions having second conductive type, such as n-type ions or dopants into the substrate 16 above the well region 26 for forming a lightly doped drain 44, in which the n-type dopants could include phosphorus (P), arsenic (As), or combination thereof. In this embodiment, if phosphorus were to be implanted, the energy of the implantation process is preferably between 5 KeV to 35 KeV and the dosage of the dopants is preferably between 2E12 atoms/cm$^2$ to 8E13 atoms/cm$^2$. On the other hand, if arsenic were to be implanted, the energy of the implantation process is preferably between 5 KeV to 25 KeV and the dosage of the dopants is preferably between 5E12 atoms/cm$^2$ to 1E14 atoms/cm$^2$.

After the lightly doped drain 44 is formed, multiple trenches 28 are formed in the substrate 16 on the memory region 20. In this embodiment, the formation of the trenches 28 could be accomplished by first forming a patterned mask (not shown), such as a patterned resist on the substrate 16, and an etching process is conducted by using the patterned mask as mask to remove part of the substrate 16 not covered by the patterned mask for forming trenches 28 crossing the lightly doped drains 44 and exposing the substrate 16. It should be noted that even though this embodiment forms the insulating layer 42 on the substrate 16 and then form the trenches 28 afterwards, it would also be desirable to directly conduct a photo-etching process to remove part of the substrate 16 for forming the trenches 28 without forming any insulating layer 42, which is also within the scope of the present invention.

Figure 3:
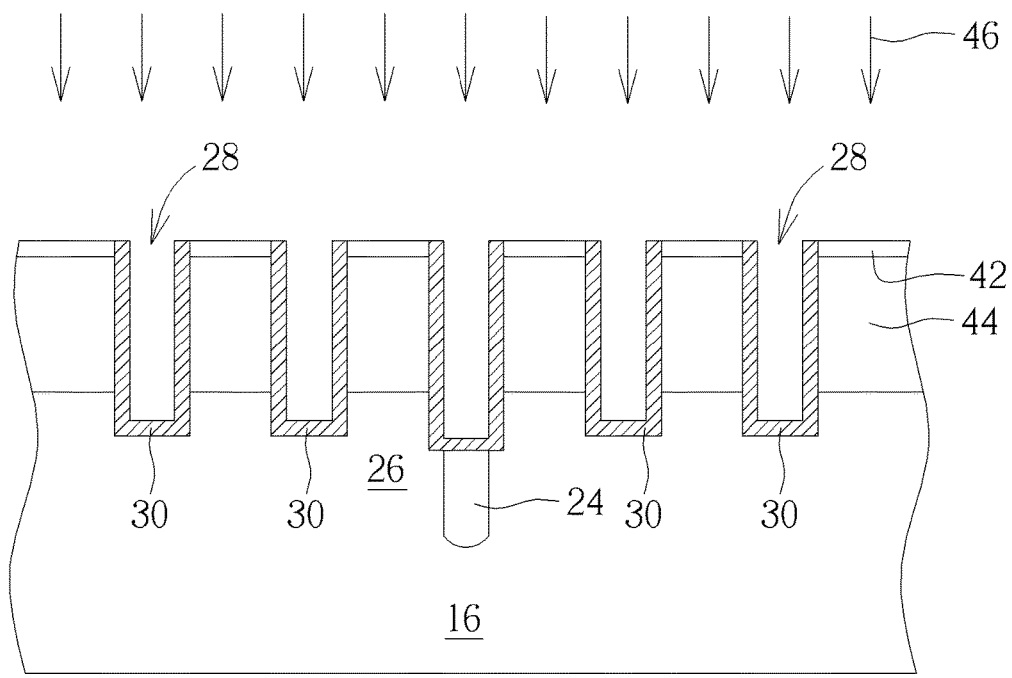

Next, as shown in FIG. 3, an ion implantation process 46 is conducted by implanting ions or dopants having first conductive type or a conductive type opposite to the lightly doped drain 44, such as p-type dopants into the substrate 16 adjacent to two sides of the trenches 28 and also the substrate 16 directly under the trenches 28. This forms doped regions 30 in the substrate 16. Viewing from a more detailed perspective, each of the doped regions 30 preferably includes a U-shaped cross-section surrounding each trench 28, in which the top surfaces of the doped regions 30 and the insulating layer 42 are coplanar. In this embodiment, the p-type dopants could include boron (B), indium (In), gallium (Ga), or combination thereof, in which the energy of the implantation process is preferably between 0.2 KeV to 20 KeV and the dosage of the dopants is preferably between 3E12 atoms/cm$^2$ to 1E14 atoms/cm$^2$.

Figure 4:
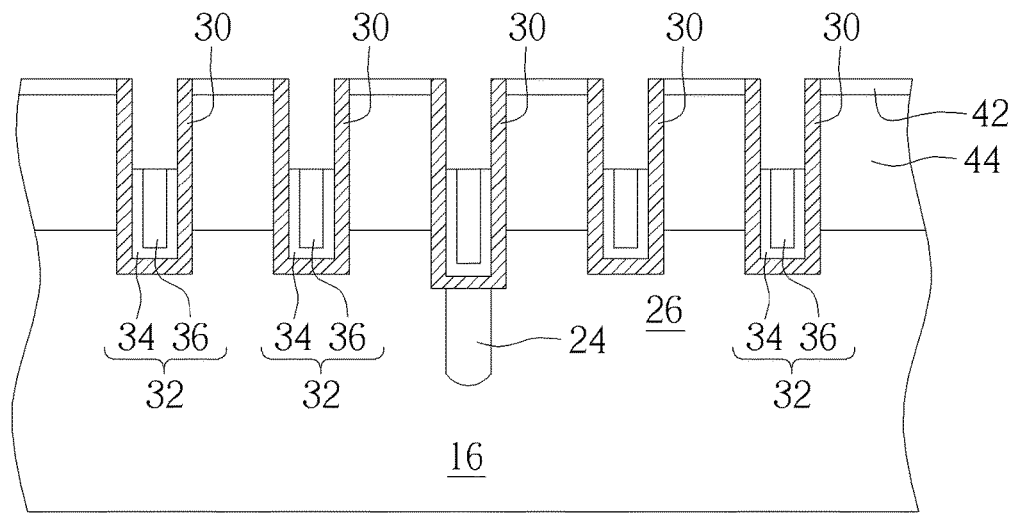

Next, as shown in FIG. 4, a buried gate is formed in each of the trenches 28. In this embodiment, the formation of the buried gates could be accomplished by first conducting an in-situ steam generation (ISSG) process to form a gate dielectric layer (not shown) made of silicon oxide in the trenches 28. Next, gate electrodes 32 are formed on the gate dielectric layer by sequentially forming a conductive layer 34 on the surface of the gate dielectric layer and a metal layer 36 on the conductive layer 34, and then using an etching process to remove part of the metal layer 36 and part of the conductive layer 34 for forming agate electrode 32 in each of the trenches 28. Preferably, the top surfaces of the metal layer 36 and the conductive layer 34 are coplanar and the top surfaces of the two layers 34 and 36 are also higher than the bottom surface of the lightly doped drain 44. According to an embodiment of the present invention, it would also be desirable to remove part of the conductive layer 34 after the gate electrodes 32 are formed so that the top surface of the conductive layer 34 is slightly lower than the top surface of the metal layer 36. In this embodiment, the conductive layer 34 preferably includes TiN and the metal layer 36 preferably includes W, Ti, or combination thereof.

Figure 5:
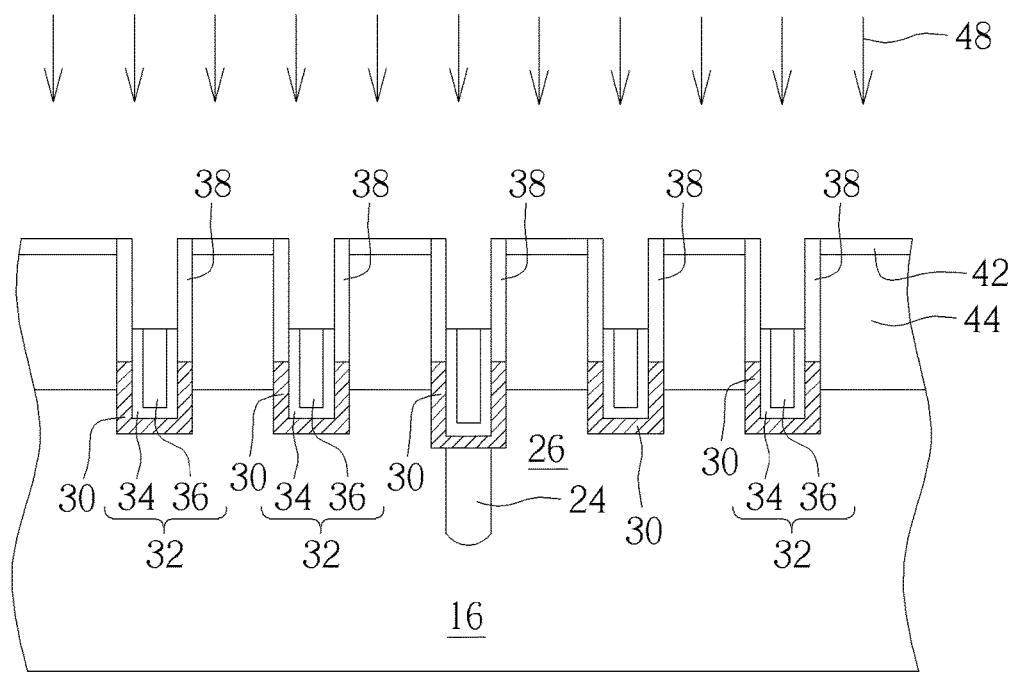

Next, as shown in FIG. 5, another ion implantation process 48 is conducted by implanting ions or dopants having same conductive type as the lightly doped drain 44 or conductive type opposite to the doped region 30 into the substrate 16. This forms doped regions 38 in the substrate 16 adjacent to two sides of the trenches 28 and above the gate electrodes 32, in which the doped regions 38 in this embodiment preferably include second conductive type dopants or n-type dopants. Preferably, the concentration of n-type dopants or ions used for forming the doped regions 38 is greater than the concentration of the original p-type dopants implanted for forming the doped regions 30 so that the p-type doped regions 30 adjacent to two sides of the trenches 28 are replaced by n-type dopants to form into n-type doped regions 38. It should be noted that even though the bottom surface of the n-type doped regions 38 shown in FIG. 5 is slightly lower than the top surface of the gate electrodes, it would also be desirable to adjust the energy of the implantation process so that the bottom surface of the doped regions 38 is even with or higher than the top surface of the gate electrodes 32, which are all within the scope of the present invention. In this embodiment, the n-type dopants implanted to form the doped regions 38 could include P, As, antimony (Sb), or combination thereof, the energy of the implantation process conducted for forming the doped regions 38 is preferably between 0.2 KeV to 20 KeV and the dosage of the dopants used to form the regions 38 is preferably between 5E12 atoms/cm$^2$ to 5E14 atoms/cm$^2$.

It should be noted that even though the aforementioned embodiment pertains to the fabrication of a n-type transistor device, it would also be desirable to following the aforementioned steps disclosed in FIGS. 1-5 to fabricate a p-type transistor by reversing the conductive type of all the aforementioned implantation processes. For instance, it would be desirable to implant n-type dopants into the substrate 16 for forming the well region 26 and using p-type dopants to form the lightly doped drain 44 in FIG. 2, implant n-type dopants into the substrate 16 adjacent to two sides of the trenches 28 for forming doped regions 30 in FIG. 3, and implant p-type dopants into the substrate 16 above the gate electrodes 32 and adjacent to two sides of the trenches 28 for forming doped regions 38, which is also within the scope of the present invention.

Figure 6:
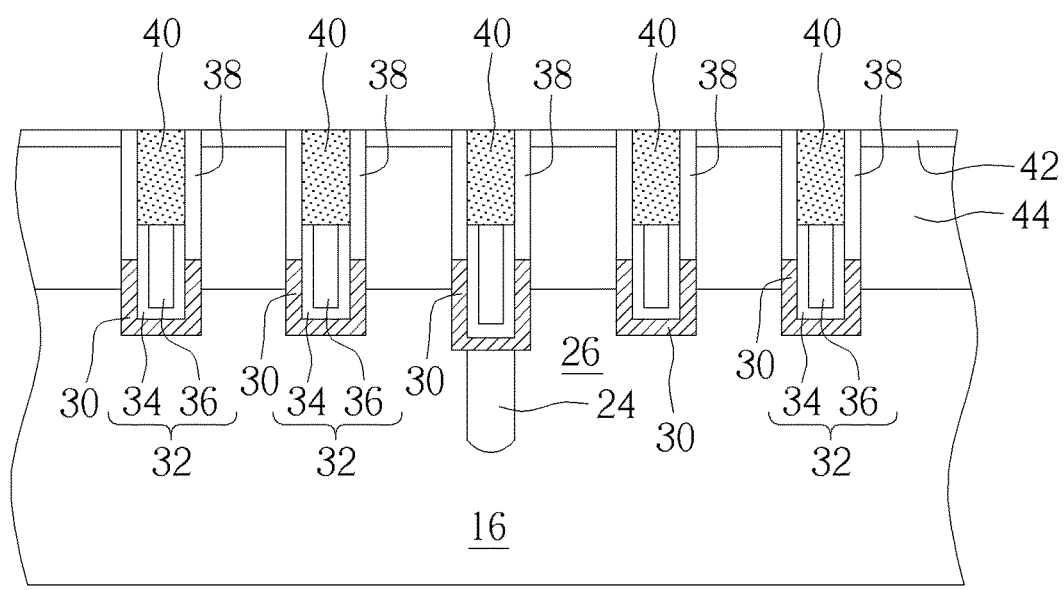

Next, as shown in FIG. 6, hard masks 40 are formed in the trenches 28 on top of the gate electrodes 32 and the top surfaces of the hard masks 40 and substrate 16 are coplanar. In this embodiment, the hard mask 40 preferably includes silicon nitride, but not limited thereto. This completes the fabrication of a buried word line according to a preferred embodiment of the present invention.

Next, additional ion implantation process could be conducted depending on the demand of the product to form doped regions (not shown) such as source/drain regions in the substrate 16 adjacent to two sides of the gate electrodes 32. Next, contact plug formation could be conducted to form bit line contact plugs adjacent to two sides of the gate electrodes 32 for electrically connecting the source/drain region and bit lines formed afterwards as well as storage node contact plugs for electrically connecting the source/drain region and capacitor formed afterwards.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate having a memory region defined thereon;
   forming a trench in the substrate;
   performing a first ion implantation process to form a first doped region having a first conductive type in the substrate around sidewalls and a bottom surface of the trench, wherein a top surface of the first doped region is higher than a top surface of the substrate;
   performing a second ion implantation process to form a lightly doped drain (LDD) having a second conductive type in the substrate before forming the first doped region;
   forming a gate electrode in the trench; and
   performing a third ion implantation process to form a second doped region having the second conductive type in the substrate above the gate electrode.

2. The method of claim 1, further comprising forming a shallow trench isolation (STI) in the substrate to define the memory region before forming the trench.

3. The method of claim 1, further comprising forming a well region having the first conductive type in the substrate before forming the trench.

4. The method of claim 1, further comprising forming the first doped region in the substrate adjacent to two sides of the trench and in the substrate directly under the trench.

5. The method of claim 1, wherein the gate electrode comprises tungsten.

6. The method of claim 1, wherein a top surface of the gate electrode is lower than a top surface of the first doped region.

7. The method of claim 1, wherein a concentration of the second doped region is higher than a concentration of the first doped region.

8. The method of claim 1, further comprising forming the second doped region in the substrate adjacent to two sides of the trench and above the gate electrode.

9. The method of claim 1, wherein the first conductive type and the second conductive type are different.

* * * * *